(12) United States Patent
Schuster

(10) Patent No.: US 7,375,897 B2
(45) Date of Patent: May 20, 2008

(54) IMAGING SYSTEMS

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 177 days.

(21) Appl. No.: 11/298,019

(22) Filed: Dec. 9, 2005

(65) Prior Publication Data

US 2006/0146411 A1 Jul. 6, 2006

Related U.S. Application Data

(63) Continuation-in-part of application No. PCT/EP2004/014100, filed on Dec. 10, 2004.

(60) Provisional application No. 60/568,006, filed on May 4, 2004, provisional application No. 60/530,623, filed on Dec. 19, 2003.

(30) Foreign Application Priority Data

| Mar. 1, 2005 | (DE) | .................. 10 2005 009 912 |
| May 4, 2005 | (DE) | .................. 10 2005 021 341 |

(51) Int. Cl.
*G02B 3/00* (2006.01)
*G02B 9/00* (2006.01)
*G02B 5/30* (2006.01)

(52) U.S. Cl. ..................... 359/649; 359/494; 359/722; 359/796

(58) Field of Classification Search ........ 359/649–651, 359/796, 494, 497

See application file for complete search history.

(56) References Cited

U.S. PATENT DOCUMENTS

| 6,958,864 B2 * | 10/2005 | McGuire, Jr. ............... 359/649 |
| 2006/0050400 A1 * | 3/2006 | Hoffmann et al. .......... 359/649 |
| 2007/0024974 A1 * | 2/2007 | Itoh et al. ................... 359/487 |

FOREIGN PATENT DOCUMENTS

| DE | 90 16 891.7 U1 | 3/1991 |
| EP | 0302124 | 8/1989 |
| GB | 2 031 606 | 4/1980 |
| JP | 1051621 | 2/1986 |

* cited by examiner

*Primary Examiner*—Jordan M. Schwartz
(74) *Attorney, Agent, or Firm*—Fish & Richardson P.C.

(57) ABSTRACT

In certain aspects, the disclosure relates to an imaging system, particularly an objective or an illumination device of a microlithography projection-exposure apparatus having an optical axis (OA), with at least one optical element of an optically uniaxial crystal material whose optical crystallographic axis is substantially parallel to the optical axis (OA) of the imaging system and which at a working wavelength has an ordinary refractive index $n_o$ and an extraordinary refractive index $n_e$, with the extraordinary refractive index $n_e$ being smaller than the ordinary refractive index $n_o$; wherein the optical element is arranged in the ray path pattern in such a way that, at least for rays of the working wavelength which meet the optical element at an angle that falls within an angular range from the optical axis, the p-polarized component is reflected more strongly than the s-polarized component.

61 Claims, 8 Drawing Sheets

IMAGING SYSTEMS

CROSS-REFERENCE TO RELATED APPLICATIONS

This application is a continuation-in-part of, and claims priority under 35 USC § 120 to, International Application No. PCT/EP2004/014100, filed Dec. 10, 2004, which claims the benefit of U.S. Provisional Application No. 60/530,623, filed Dec. 19, 2003, and U.S. Provisional Application No. 60/568,006, filed May 4, 2004. This application also claims benefit of DE 10 2005 009 912.2, filed Mar. 1, 2005 and to DE 10 2005 021 341.3, filed May 4, 2005.

TECHNICAL FIELD

The disclosure relates to an imaging system, in particular for an objective or an illumination device of a microlithography projection-exposure apparatus. In particular, the disclosure relates to a projection objective of a microlithography projection-exposure apparatus that allows a higher level of interference contrast to be achieved.

BACKGROUND

Microlithography finds application in the production of micro-structured components such as for example integrated circuits or LCDs. The microlithography process is carried out in a so-called projection-exposure apparatus which includes an illumination system and a projection objective. The image of a mask (also referred to as reticle) which is illuminated by means of the illumination system is projected by means of the projection objective onto a substrate (e.g., a silicon wafer) that is coated with a light-sensitive coating (referred to as photoresist) and is arranged in the image plane of the projection objective, the purpose of this projection being to transfer the mask structure onto the light-sensitive coating of the substrate. The contrast of the mask's image on the light-sensitive coating can affect the fidelity of transfer of the mask structure to coating.

SUMMARY

The contrast of an image in the light-sensitive coating can be increased if the image is formed from two-ray interference between rays whose respective polarizations are oriented perpendicular to their planes of incidence. In the present context and hereinafter, the polarization component whose electrical field vector is perpendicular to the plane of incidence of a light ray is referred to as s-component. The polarization component whose electrical field vector oscillates in the direction parallel to the plane of incidence of a light ray is referred to as p-component.

A tangential polarization distribution can provide a high-contrast image in the resist. A tangential polarization distribution refers to a distribution where the planes of oscillation of the electrical field vectors of the individual linearly polarized light rays in a pupil plane of the system are oriented perpendicular to the radius that is directed towards the optical axis.

Embodiments disclosed herein can provide for improved transport of a tangential state of polarization that has been created within the illumination system or within the projection objective all the way to the resist. In other words, disclosed embodiments can provide reduced depolarization of a light field having tangential polarization from the location in the illumination system or projection objective where the tangential polarization is formed to the resist. These depolarization effects can be caused, for example, by structures in the reticle, by phase discontinuities occurring for different states of polarization on reflective elements, and also by the phenomena of stress-induced, natural and intrinsic birefringence.

Embodiments disclosed herein can create an imaging system which provides the possibility to achieve a higher level of interference contrast and thus an improved image quality, particularly in the high aperture range.

Embodiments of imaging systems, particularly in the form of an objective or an illumination device of a microlithography projection-exposure apparatus, and having an optical axis, can include:

at least one optical element of an optically uniaxial crystal material whose optical crystallographic axis is substantially parallel to the optical axis (OA) of the imaging system and which at a working wavelength has an ordinary refractive index $n_o$ and an extraordinary refractive index $n_e$, with the extraordinary refractive index $n_e$ being smaller than the ordinary refractive index $n_o$, wherein the optical element is arranged in the ray path pattern in such a way that, at least for rays of the working wavelength which meet the optical element at an angle that falls within an angular range from the optical axis, the p-polarized component is reflected more strongly than the s-polarized component.

The difference $n_o - n_e$ between the ordinary refractive index $n_o$ and the extraordinary refractive index $n_e$ is preferably at least 0.1, with higher preference at least 0.2, and with even higher preference at least 0.25.

Based on the condition that the ordinary refractive index $n_o$ in the optical element is larger than the extraordinary refractive index $n_e$, the invention opens up the possibility that the s-component is subjected to a smaller refractive index (i.e., the extraordinary refractive index $n_e$), while the p-component is subjected to a larger refractive index (i.e., the ordinary refractive index $n_o$). The invention makes use of this opportunity in that at least within a predetermined angular range, viz. at sufficiently large ray angles relative to the optical axis, a comparatively stronger reflection occurs for the p-component than for the s-component, which is due to a higher Fresnel reflection for the p-component in comparison to the s-component, or even to a total reflection of the p-component, depending on the ratio of refractive indices at the respective entry angle of a ray into the inventive optical element.

With preference, the optical element is arranged in the ray path pattern in such a way that at least one ray falls on the optical element under an angle to the optical axis which is equal to at least $\arcsin(n_e/n')$, wherein n' indicates that refractive index which applies to the p-polarized component in the medium adjacent to a light entry surface of the optical element, and wherein n' is larger than $n_e$. This ray has an angle with the optical axis that is larger than the limit angle for total reflection of the p-polarized component. In particular, the optical element can also be arranged in such a way in the ray path pattern that it is met only by rays which are directed at an angle of at least $\arcsin(n_e/n')$ relative to the optical axis, so that the condition for total reflection of the p-polarized component is satisfied at least approximately for all of the rays falling on the optical element.

As a further possibility, the optical element in certain embodiments are arranged in the ray tracing pattern in such a way that at least one ray meets the optical element under an angle in the range between $\arcsin(n_e/n')$ and $\arcsin(n_o/n'')$, wherein n" represents the refractive index that applies to the s-polarized component in the medium adjacent to a light entry surface of the optical element, and wherein n" is larger than $n_o$. This ray has an angle relative to the optical axis that is smaller than the limit angle for total reflection of the s-polarized component. In particular, the optical element can be arranged in such a way in the ray path pattern that it is met only by rays that are within an angular range between $\arcsin(n_e/n')$ and $\arcsin(n_o/n'')$ relative to the optical axis, so that the condition for total reflection of the p-polarized component and for an absence of total reflection of the s-polarized component is satisfied at least approximately for all of the rays falling on the optical element.

In a case where the medium adjacent to the light entry surface of the optical element is an optically uniaxial medium whose optical crystallographic axis is parallel to the optical axis of the imaging system, the refractive index n' that applies to the extraordinary ray in the situation described above is the extraordinary refractive index $n_e'$ of said optically uniaxial medium, and the refractive index n" that applies to the ordinary ray is the ordinary refractive index $n_o'$ of said optically uniaxial medium. If the medium adjacent to the light entry surface of the optical element is an optically isotropic medium, the refractive index n of the isotropic medium applies to the extraordinary ray as well as to the ordinary ray.

With preference, at least for some of the rays that fall on the optical element under an angle in the predetermined angular range relative to the optical axis, the p-component is met with total reflection on the optical element. As a consequence of the refractive indices $n_e$ and $n_o$ being different from each other, one achieves the result that with sufficiently large ray angles of the incident light on the optical element, a total reflection caused by a discontinuity in the refractive index occurs only for the p-polarized component, while no total reflection takes place for the s-polarized component insofar as it is subjected to the significantly higher ordinary refractive index $n_o$ and therefore incurs only Fresnel-type reflection losses that depend on the refractive index ratio at the incidence of a ray on the optical element.

The concept of using the phenomenon of total reflection according to the invention is also advantageous insofar as, for example in a microlithography projection apparatus, no light energy associated with the totally reflected p-polarized component is carried into crystal material that follows in the light path, nor into the resist, where the absorbed light could cause the crystal material to heat up and possibly lead to non-uniform absorption of light energy. Rather the eliminated light ray component returns on the path that it has already completed up to this point in the imaging system and thus becomes lost in the imaging system.

At the same time, no further disadvantage can come from the fact that the elimination of the p-polarized component in accordance with the invention by using the total reflection occurs by nature only in a limited angular range (namely for high-aperture light rays), because at smaller aperture angles (where for example non-polarized light still leads to a sufficient amount of interference) achieving a state of s-polarization is less important.

According to certain embodiments, an upper limit of the angular range is set by the maximum aperture angle $\epsilon_{max}$ at the light entry surface of the optical element. Further, a lower limit of the predetermined angular range is preferably smaller than 0.85 times, with higher preference smaller than 0.7 times, and with even stronger preference smaller than 0.5 times the magnitude of the maximum aperture angle $\epsilon_{max}$.

The material of the optical element can have a trigonal (rhombohedral), tetragonal, or hexagonal crystallographic structure.

A material bordering on the light entry surface of the optical element according to the invention can be an amorphous material, a liquid, a crystal material with a cubic crystal structure, or also an optically uniaxial crystal material whose optical crystallographic axis is oriented substantially parallel to the optical axis (OA) of the imaging system.

According to certain embodiments, the optical element is arranged in the light path in such a way that the ray tracing pattern in the optical element is substantially telecentric, meaning that the principal rays run substantially parallel to the axis. Relative to the direction of the principal rays, at least the angles of the aperture rays at which a total reflection may take place are constant for all of the ray bundles, so that a uniform s-polarization can be achieved over all image heights. If the principal rays at the location of the optical element are not telecentric, one can use a curved plate for the optical element as a way of forcing the principal rays into telecentricity in the plate. However, this can be successful only if a refractive index ratio exists relative to $n_o$ at the entry into the optical element.

According to certain embodiments, at least one lens with a location-dependent variable reflectivity is arranged in the light path in such a way that a location-dependent variation of the transmissivity of the optical element is at least partially compensated. This measure serves to accommodate the fact that the Fresnel-reflection losses (for example in the range of total reflection of the p-component) are likewise angle-dependent and would therefore, if left uncompensated, lead to a non-uniform transmissivity of the optical element over its aperture. The locally variable reflectivity of the aforementioned lens is achieved preferably with a reflective coating in order to avoid an undesirable heating of the kind that would occur with a variable absorption.

The optical element can be one of three elements that are located nearest to the image plane of the imaging system, and with preference the last optical element of the imaging system on the image-plane side.

The optical element according certain embodiments is a planar-parallel plate. The optical element can be made in particular of a material that includes a $CO_3$ compound. The optical element can also be made of a mixed crystal material which is comprised of a metal oxide and a carbon oxide, or of a metal and $CO_3$. The optical element can be made in particular of a material selected from the group that includes magnesite ($MgCO_3$), dolomite ($CaMg[CO_3]_2$), rhodochrosite ($MnCO_3$), calcite ($CaCO_3$), smithsonite ($ZnCO_3$), eitelite ($MgNa_2 [CO_3]_2$ or $Na_2CO_3.MgCO_3$), potassium magnesium carbonate ($MgK_2[CO_3]_2$ or $K_2CO_3.MgCO_3$), butschliite ($Ca_2K_6[CO_3]_5.6H_2O$), norsethite ($BaMg[CO_3]_2$ or $BaCO_3.MgCO_3$), cordylite ($Ce_2Ba[(CO_3)_3F_2]$ or $La_2Ba[(CO_3)_3F_2]$), manganese dolomite ($MnCa[CO_3]_2$ or $MnCO_3.CaCO_3$) and manganese spar ($MnCO_3$).

The optical element can further be made of a material that contains an $NO_3$ compound. The optical element can be made in particular of sodium nitrate ($NaNO_3$) or lithium nitrate ($LiNO_3$).

In accordance with some embodiments, the optical material is made of a material selected from the group that includes gehlenite ($2CaO.Al_2O_3SiO_2$), potassium cyanate (KCNO), chloromagnesite ($MgCl_2$), $RbClO_3$, $SrCl_2.6H_2O$, $LiO_3$, $Ba(NO_2)_2.H_2O$, $Al_2O_3.MgO$, $[PdCl_4](NH_4)_2$ and barium borate ($BaB_2O_4$).

In certain embodiments, the optical element is a second optical element, with a first optical element facing the light entry surface of said second optical element, where the first optical element has a refractive index that is larger than the extraordinary refractive index $n_e$ of the second optical element.

The material of the first optical element can be an amorphous material, a liquid, a crystalline material of cubic crystallographic structure or also an optically uniaxial crystal material whose optical crystallographic axis is substantially parallel to the optical axis (OA) of the imaging system. According to certain embodiments, the first optical element can also be composed of at least two partial elements that are cut in the same crystallographic orientation and are arranged in a rotated position relative to each other about the optical axis. This allows the effect of additional spatial dispersion which exists in the optically uniaxial crystal to be at least partially compensated.

The arrangement with the first and the second optical element may be particularly well suited for restoring or establishing order in the state of polarization shortly before the light reaches the resist, in order to come as close as possible to an optimal state of s-polarization especially for light rays arriving under high angles of incidence. According to a preferred embodiment, the light entering the aforementioned first optical element is therefore at least 80% s-polarized, preferably at least 90%. This has the advantage that (for example in comparison to light with only a small content of s-polarization) only a minor portion of the light is "rejected" by the imaging system because of total reflection. The stray light can in this case be controlled by appropriate measures such as, e.g., a polarization-dependent stray light stop.

According to some embodiments, the light entering the aforementioned first optical element is non-polarized or has a natural polarization. Embodiments therefore may provide the option of mixing the polarization first before the light enters the arrangement of the aforementioned first optical element and the second optical element, and/or to use light that is naturally non-polarized or artificially created by statistical mixing of the polarization (over time and/or with regard to its spatial distribution), or light with a well-defined circular polarization, for producing the s-polarization in accordance with the invention.

According to a further aspect of the invention, the material of the optical element in an analogous design can also be an optically uniaxial crystal material which at the working wavelength has the reverse property, so to speak, i.e., an ordinary refractive index $n_o$ and an extraordinary refractive $n_e$ that is larger than $n_o$, with the optical crystallographic axis oriented substantially parallel to the optical axis of the imaging system. In this case, the aforementioned total reflection occurs in the ray component that is subject to the ordinary refractive index $n_o$, i.e., the s-polarized component, while the p-polarized component, which is subject to the extraordinary refractive index $n_e$, remains largely unaffected while as it passes through the optical element. In this case, too, good telecentric properties are advantageous for preserving the plane of incidence, because in this case the plane of incidence lies approximately in a main section plane, so that the condition is met under which alone the light ray components that are subject to $n_e$ inside the crystal will not leave the plane of incidence. Consequently, for light of the working wavelength, the crystal will allow passage of the component that is subject to $n_e$.

According to a further aspect, the disclosure also relates to an imaging system, in particular an objective or an illumination device of a microlithography projection-exposure apparatus that has at least one element made of an optically uniaxial crystal material with an ordinary refractive index $n_o$ and an extraordinary refractive index $n_e$, where the difference $n_o-n_e$ between the ordinary refractive index $n_o$ and the extraordinary refractive index $n_e$ is at least 0.1, preferably at least 0.2, and with an even higher preference at least 0.25.

With preference, the optical crystallographic axis of the optical element is substantially parallel to the optical axis (OA) of the imaging system.

In certain embodiments, the optical element has at least one planar surface that is substantially perpendicular to the optical axis (OA) of the imaging system. The optical element can in particular be a planar-parallel plate.

In accordance with a further aspect, the disclosure also relates to the use of a material as a raw material for the manufacture of an optical element in an objective or in an illumination device of a microlithography projection-exposure apparatus, wherein said material includes a $CO_3$ compound or an $NO_3$ compound and/or is selected from the group that includes magnesite ($MgCO_3$), dolomite ($CaMg[CO_3]_2$), rhodochrosite ($MnCO_3$), gehlenite ($2CaO.Al_2O_3SiO_2$), calcite ($CaCO_3$), smithsonite ($ZnCO_3$), sodium nitrate ($NaNO_3$), potassium cyanate (KCNO), eitelite ($MgNa_2[CO_3]_2$ or $Na_2CO_3.MgCO_3$), potassium magnesium carbonate ($MgK_2[CO_3]_2$ or $K_2CO_3.MgCO_3$), chloromagnesite ($MgCl_2$), $RbClO_3$, butschliite ($Ca_2K_6[CO_3]_5.6H_2O$), $SrCl_2.6H_2O$, lithium nitrate ($LiNO_3$), $LiO_3$, norsethite ($BaMg[CO_3]_2$ or $BaCO_3.MgCO_3$), cordylite ($Ce_2Ba[(CO_3)_3F_2]$ or $La_2Ba[(CO_3)_3F_2]$, $Ba(NO_2)_2.H_2O$, $Al_2O_3.MgO$, manganese dolomite ($MnCa[CO_3]_2$ or $MnCO_3.CaCO_3$), manganese spar ($MnCO_3$), $[PdCl_4](NH_4)_2$, and barium borate ($BaB_2O_4$).

The disclosure also relates to a microlithography projection-exposure apparatus, a method for the microlithographic production of micro-structured components, and a micro-structured component.

Further embodiments are presented in the description as well as in the dependent claims.

DETAILED DESCRIPTION

Figure 1:
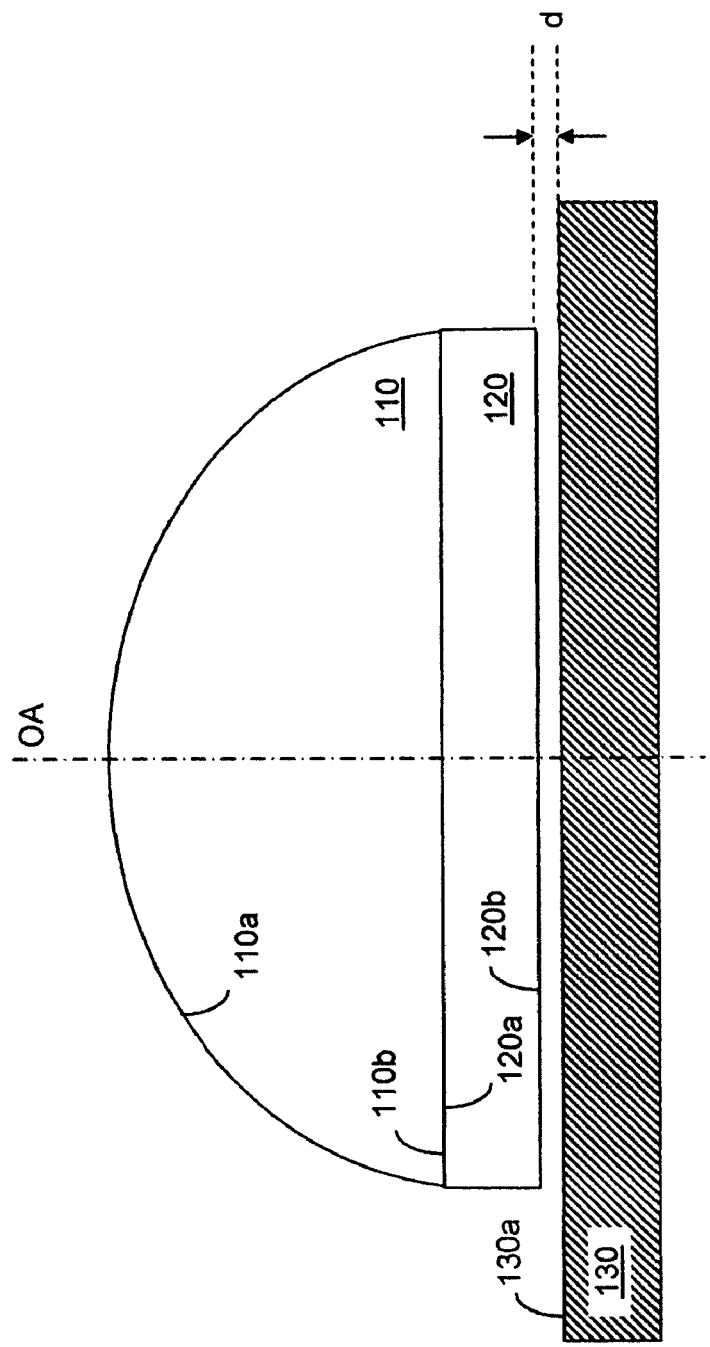
FIG. 1 shows a schematic representation of a part taken from an imaging system according to a first embodiment of the invention.

FIG. 1 schematically illustrates a first optical element as used in an imaging system according to the invention, in the form of a planar-convex lens 110 which in this exemplary embodiment is made of sapphire ($Al_2O_3$). Only as an example and without implying any limitation, the planar-convex lens 110 may have a thickness (center thickness) of typically about 30 to 60 mm.

According to FIG. 1, a second optical element (of calcite, $CaCO_3$, in the illustrated example) in the form of a planar-parallel plate 120 is joined intimately to the light exit surface 110b of the planar-convex lens 110, for example through a seamless joining or wringing technique. The planar-parallel plate 120, again only as an example and without implying any limitation, can typically have a thickness of about 3 to 10 mm; the thickness can also be smaller or larger.

The second optical element, in this case the planar-parallel plate 120, is made of an optically uniaxial crystal material which at the working wavelength has an ordinary refractive index no and an extraordinary refractive index $n_e$, and an optical crystallographic axis of the second material is oriented substantially parallel to the optical axis (OA) of the imaging system. Said optically uniaxial crystal material is selected so that the ordinary refractive index $n_o$ is significantly larger than the extraordinary refractive index $n_e$, with the difference $n_o - n_e$ being preferably at least 0.05, with stronger preference at least 0.1, with even higher preference at least 0.2, and with an even more elevated level of preference 0.25. The optical element is furthermore arranged in the light path in such a way that the ray tracing pattern in the optical element is substantially telecentric, i.e., within a range of light ray patterns in which the principal rays are substantially parallel to the axis.

Figure 2:
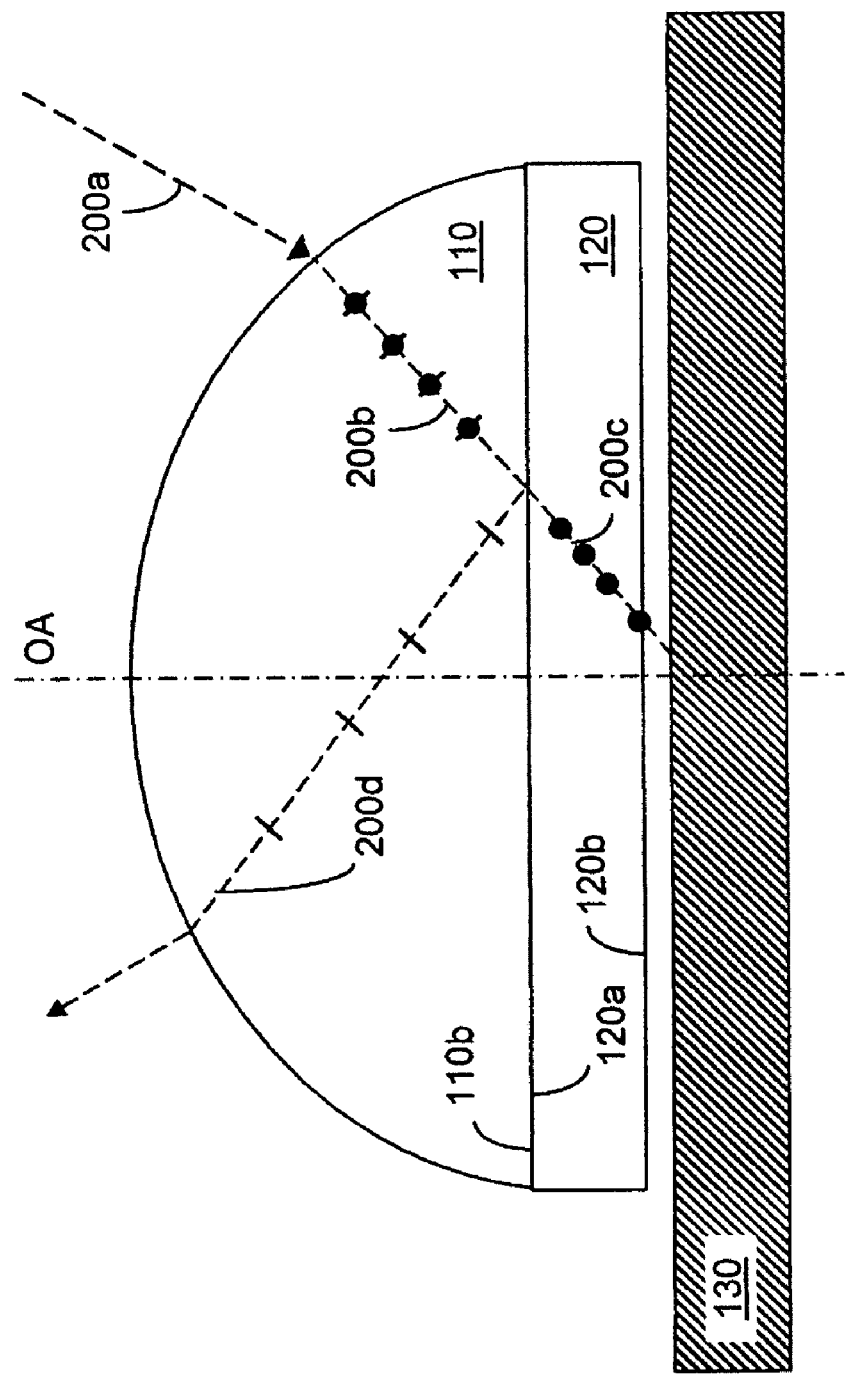
FIG. 2 shows a schematic representation that helps to explain the effect that the arrangement of FIG. 1 has on an incident light ray.

For a clearer understanding of the arrangement shown in FIG. 1, the reader is referred to FIG. 2.

FIG. 2 schematically illustrates a light ray 200a falling on the light entry surface 110a of the planar-convex lens 110 and being subjected to a refraction at the transition into the planar-convex lens 110, continuing at this point in the light ray section 200b. In the representation of FIG. 2, the s-component (whose E-vector oscillates perpendicular to the plane of incidence) is indicated by dots, and the p-component (whose E-vector oscillates in the level of incidence) is indicated by short transverse lines.

As indicated in FIG. 2, there is practically no effect on the s-component, which oscillates in the direction perpendicular to the plane of incidence, as it travels from the light entry surface 110a of the planar-convex lens 110 through the planar-parallel plate 120 to the light-coupling surface 130a of the resist 130, except for a minor change in direction. Said s-component whose oscillation is directed perpendicular to the plane of incidence is inside the optically uniaxial crystal material of the planar-parallel plate 120 subject to the latter's ordinary refractive index $n_o$, for which the refracted ray remains in its plane of incidence also in the optically uniaxial crystal. Thus, this light ray component 200c passes through the planar-parallel plate 120 and exits from it while staying in its plane of incidence, whereupon it enters through an optical coupling zone (e.g., the optical near field) into the resist 130, where it can come into interference.

If one considers on the other hand the ray component with the p-polarization inside the planar-convex lens 110, this component is subject to the extraordinary refractive index $n_e$ of the optically uniaxial crystal material of the planar-parallel plate 120, with $n_e$ being significantly smaller than the ordinary refractive index $n_o$. At the border surface to the second optical element, in this case the planar-parallel plate 120, the p-component is therefore subject to a smaller refractive index $n_e$, so that total reflection occurs when a certain angle of incidence is exceeded which depends on the respective indices of refraction on both sides, or when a certain numerical aperture value is exceeded, so that a p-polarized ray component 200d beyond these limits undergoes a total reflection at the light entry surface 120a of the planar parallel plate 120 and travels back through the imaging system (i.e., in this example back through the projection objective, and by way of the reticle into the illumination system). In the light which in FIG. 2 falls on the light-coupling surface 130a of the resist 130, those rays that arrive at a sufficiently low angle of incidence will be s-polarized because the p-polarized light component has been removed by total reflection.

Following is a quantitative discussion of the exemplary embodiment, wherein the planar-convex lens 110 is made of $Al_2O_3$ and the planar-parallel plate 120 is made of $CaCO_3$. At a working wavelength of, e.g. 248.338 nm, the following refractive indices are applicable to this example:

| Element | | |
|---|---|---|
| Planar-convex lens (110): $Al_2O_3$ | $n_o' = 1.8467$ | $n_e' = 1.8369$ |
| Planar-parallel plate (120): $CaCO_3$ | $n_o = 1.7721$ | $n_e = 1.5342$ |

The limit angle for total reflection at a border surface is generally obtained from the equation $\epsilon_{TR} = \arcsin(n/n')$, wherein n' represents the refractive index in the medium before the border surface and n represents the refractive index in the medium after the border surface. For the p-polarized ray component which is in each case subject to the extraordinary refractive index $n_e$, or $n_e'$, one obtains accordingly a limit angle for total reflection of $$\epsilon_{p,TR} = \arcsin(n_e/n_e') \approx \arcsin(1.5342/1.8369) \approx 56.640.$$

A light ray falling on the border surface between the planar-convex lens 110 and the planar-parallel plate 120 at an angle larger than the limit angle $\epsilon_p$ from the normal direction of the border surface will therefore be subject to a total reflection of its p-component, so that the s-component alone will be transmitted. For an estimate at high apertures, the indices $n_e$, $n_e'$ of the two media can be entered directly, but for an exact calculation one will, of course, have to take the angle-dependence of the extraordinary refractive index into account.

With the ordinary refractive index $n_o'$ of the planar-convex lens 110 in the present case being somewhat smaller than the ordinary refractive index $n_o$ of the planar-parallel plate 120, there is also a further limit angle $\delta_{s,TR}$ for the total reflection of the s-polarized component which is subject to the ordinary refractive indices $n_o$ and $n_o'$, according to the relationship: $\epsilon_{s,TR} = \arcsin (n_o/n_o') \approx \arcsin(1.7721/1.8467) \approx 73.66°$. A light ray falling on the border surface between the planar-convex lens 110 and the planar-parallel plate 120 at an angle larger than the limit angle $\epsilon_{s,TR}$ from the normal direction of the border surface will therefore be subject to a total reflection of its s-component as well. As an overall consequence, a transmitted ray with an angle of incidence in the range $56.64° < \epsilon < 73.66°$ as measured from the normal direction of the surface will have a pure s-polarization. In practice, when taking into account the Fresnel losses in the s-component which become larger at increasing angles, one ends up with a usable incidence range up to a maximum angle of about $\epsilon_{max} \approx 0.95 * 73.66° \approx 70°$.

If the ordinary refractive index $n_o'$ of the material of the planar-convex lens 110 and the ordinary refractive index $n_o$ of the material of the planar-parallel plate 120 meet the condition $n_o \geq n_o'$, no total reflection takes place for the s-polarized component and the relative proportion of the light transmitted with s-polarization is maximized. The upper limit of the range in which the p-component is reflected more strongly on the optical element than the s-component is in this case set by the maximum aperture angle. In the other case that was also described above, where the ordinary refractive index $n_o$, of the planar-convex lens 110 (or the refractive index n' in the case of a cubic-crystalline or anisotropic material of the planar-convex lens 110, and likewise in the medium before the planar-parallel plate 120) is larger than the ordinary refractive index $n_o$ of the planar-parallel plate 120, the upper limit of the range in which the p-component is reflected more strongly on the optical element than the s-component is set by the limit angle $\epsilon_{s,TR}$ for total reflection of the s-component.

Outside of the range for total reflection, i.e. for $\epsilon < \epsilon_{s,TR}$, the s- and p-polarized components are subject to respectively different amounts of Fresnel reflection losses, which are defined by the relationships:

$$\rho_p = \frac{\tan^2(\varepsilon - \varepsilon')}{\tan^2(\varepsilon + \varepsilon')}$$

for the p-polarized component, and $$\rho_s = \frac{\sin^2(\varepsilon - \varepsilon')}{\sin^2(\varepsilon + \varepsilon')}$$

for the s-polarized component.

As an example, if a light ray meets the border surface between the planar-convex lens 110 and the planar-parallel plate 120 at an angle of $\epsilon=50°$, the angle after refraction at the border surface according to the law of refraction is obtained as $\epsilon_s'=\arcsin[(n_o'/n_o)*\sin(50°)] \approx 52.96°$ for the s-component, and $\epsilon_p'=\arcsin[(n_e'/n_e)*\sin(50°)] \approx 66.51°$ for the p-component. These calculations are approximate insofar as the values used for the extraordinary indices of refraction are the maximum values given above and it has not been taken into account that the extraordinary refractive index $n_e(\epsilon)$ in an optically uniaxial crystal depends on the angle relative to the principal crystallographic axis in accordance with the relationship $$\frac{1}{(n(\varepsilon))^2} = \frac{\cos^2(\varepsilon)}{n_o^2} + \frac{\sin^2(\varepsilon)}{n_e^2}$$

(wherein $n(\epsilon)=n_e$ for the angle $\epsilon=90°$).

Accordingly, the actual extraordinary refractive index $n(\epsilon)$ is smaller than $n_e$ and approaches the value for $n_e$ at large aperture angles.

In the foregoing example, using an approximation with regard to the Fresnel reflection losses, one obtains the approximate values of $\rho_p \approx 0.0219$ and $\rho_s \approx 0.0028$, respectively, making it evident that with the exemplary value of $\epsilon=50°$, the p-component is reflected significantly more strongly than the s-component.

The angular range for $\epsilon$ where the p-component is reflected more strongly than the s-component depends on the refractive index ratios for the s- and p-component in each specific case and thus depends on the respective values of the refractive indices $n_o$ and $n_e$ of the planar-parallel plate 120 as well as the refractive indices $n_o'$ and $n_e'$ (or the refractive index n') of the planar-convex lens 110, where for the extraordinary refractive indices $n_e$ and $n_e'$ one needs to take into account their respective dependencies on the angle $\epsilon$. The "reverse" of the foregoing effect occurs as soon as the value for $n_o-n_e(\epsilon)$ at a certain angle $\epsilon$ becomes smaller than the value for $n_e'(\epsilon)-n_e(\epsilon)$, because the s-component is reflected more strongly in this case.

With preference, the relevant refractive index ratios for the s- and p-component at the light entry surface to the optical element are selected so that a lower limit of the angle range in which the p-component is reflected more strongly than the s-component is smaller than 0.85 times, preferably smaller than 0.7 times, and with even higher preference smaller than 0.5 times the maximum aperture angle $\epsilon_{max}$.

The planar-convex lens 110 can also be made of any other material that is substantially transparent for light of the working wavelength (e.g., 193 nm). According to a preferred embodiment, the planar-convex lens 110 is made of spinel crystal material ($MgAl_2O_4$) in (111)-orientation (meaning that the optical axis OA is perpendicular to the crystallographic {111}-plane and thus parallel to the crystallographic <111>-direction), and the planar-parallel plate 120 is made of sodium nitrate ($NaNO_3$). To protect the water-soluble sodium nitrate against moisture, the planar-parallel plate 120 in this case needs to be provided with a protective coating, for example of magnesium oxide (MgO) (see further embodiments).

Furthermore, the material of the planar-convex lens 110 can also be an amorphous or glassy, quasi-isotropic material such as quartz glass ($SiO_2$) or spinel glass ($MgAl_2O_4$), a spinel-based ceramic material, a crystal material of cubic crystallographic structure such as for example an oxide crystal, or also an optically uniaxial crystal material (such as for example gehlenite ($2CaOAl_2O_3SiO_2$) whose optical crystallographic axis is substantially parallel to the optical axis (OA) of the imaging system. Furthermore, if the first element (in this case the planar-convex lens 110) is made of a cubic-crystalline or of an optically uniaxial crystal material, the first element can also be assembled from at least two partial elements which are of the same crystallographic cut and are arranged with a rotation relative to each other about their principal crystallographic axis (see further embodiments).

Table 1 presents an overview of materials which can be used for producing the second optical element. Also shown for each material are the ordinary refractive index $n_o$ as well as the extraordinary refractive index $n_e$ at $\lambda=589$ nm. In addition, some values (identified by *) are stated for $\lambda=365.5$ nm, as well as (identified by ) for $\lambda=248.338$ nm and (identified by *) for $\lambda=193.304$ nm. It should be noted that the refractive indices increase towards lower wavelengths and in particular towards the working wavelengths of less than 250 nm that are typical for microlithography applications (preferably about 248 nm, 193 nm or 157 nm), where $n_o$ in each case increases more strongly than $n_e$, so that the refractive index difference $n_o-n_e$ takes on even larger values than at $\lambda=589$ nm.

TABLE 1

| Material | $n_o$ | $n_e$ |
|---|---|---|
| Magnesite ($MgCO_3$) | 1.7031 | 1.5133 |
| | (1.7355)* | (1.5272)* |
| Dolomite ($CaMg[CO_3]_2$) | 1.6799 | 1.5013 |
| Rhodochrosite ($MnCO_3$) | 1.818 | 1.595 |
| Gehlenite ($2CaO \cdot Al_2O_3SiO_2$) | 1.687 | 1.658 |
| Calcite ($CaCO_3$) | 1.6585 | 1.4864 |
| | (1.6923)* | (1.5016)* |
| | (1.7721)** | (1.5342)** |
| Smithsonite ($ZnCO_3$) | 1.8485 | 1.6212 |

TABLE 1-continued

| Material | $n_o$ | $n_e$ |
|---|---|---|
| Eitelite (MgNa$_2$[CO$_3$]$_2$ or Na$_2$CO$_3$•MgCO$_3$) | 1.605 | 1.450 |
| Potassium magnesium carbonate (MgK$_2$[CO$_3$]$_2$ or K$_2$CO$_3$•MgCO$_3$) | 1.597 | 1.470 |
| Butschliite (Ca$_2$K$_6$[CO$_3$]$_5$•6H$_2$O) | 1.595 | 1.455 |
| SrCl$_2$•6H$_2$O | 1.53560 | 1.48565 |
| Norsethite (BaMg[CO$_3$]$_2$ or BaCO$_3$•MgCO$_3$) | 1.694 | 1.519 |
| Cordylite (Ce$_2$Ba[(CO$_3$)$_3$F$_2$] or La$_2$Ba[(CO$_3$)$_3$F$_2$] | 1.764 | 1.577 |
| Manganese dolomite (MnCa[CO$_3$]$_2$ or MnCO$_3$•CaCO$_3$) | 1.741 | 1.536 |
| Manganese spar (MnCO$_3$) | 1.818 | 1.595 |
| Sodium nitrate (NaNO$_3$) | 1.5874 | 1.3361 |
| Lithium nitrate (LiNO$_3$) | 1.735 | 1.435 |
| Barium borate (BaB$_2$O$_4$) | 1.6706 | 1.5542 |
| | (1.7022)* | (1.5751)* |
| | (1.7776)** | (1.6281)** |
| | (1.9197)*** | (1.7207)*** |
| Potassium cyanate (KCNO) | 1.575 | 1.412 |
| Ba(NO$_2$)$_2$•H$_2$O | 1.665 | 1.629 |
| Chloromagnesite (MgCl$_2$) | 1.675 | 1.590 |
| RbClO$_3$ | 1.572 | 1.484 |
| LiO$_3$ | 1.846 | 1.711 |
| Al$_2$O$_3$•MgO | 1.665 | 1.629 |
| [PdCl$_4$](NH$_4$)$_2$ | 1.712 | 1.549 |

Furthermore, the first optical element can also have a different geometry than the planar-convex lens 110 which serves merely as an example, but a shape with a substantially planar light exit surface is preferred, and an outward-curved light-entry surface is also preferred.

Embodiments are not limited to an arrangement where the planar-parallel plate 120 is joined directly to the first optical element or planar-convex lens 110. Alternatively, an optical coupling can also occur through an optical near field or also through a suitable immersion medium. Further, instead of the substantially planar-parallel plate 120, and depending on the optical properties of the material (refractive indices, absorption properties), one could also use a thin, grown-in-place crystal layer (see further embodiments).

The light exit surface 120b of the planar-parallel plate 120 in accordance with FIG. 1 is located at a distance d from a light-coupling surface 130a of the light-sensitive layer 130 (the resist) which is arranged on the substrate, wherein the distance d is commensurate with an optical near-field range at the given working wavelength. The range of the optical near field is limited to distances smaller than 4×λ. In the example, a value of e.g. λ/20 may be selected for d, which at a working wavelength of λ=193 nm corresponds to a distance d1=d2=9.65 nm.

In the preferred embodiment, the second optical element 120 is the last optical element on the image-plane side of a projection objective. However, embodiments are not limited to this particular configuration, so that the arrangement of the first and second optical elements 110, 120 could also be placed at another suitable location in an imaging system, in particular at an intermediate image plane of a projection objective or also in an illumination system, where a sufficiently high value of the numerical aperture is reached so that the desired effect of a stronger reflection of the p-component or a total reflection of the p-component is achieved. Applied to a general case, if there is optical coupling through a near field, the distance d represents the distance of the light exit surface 120b of the planar-parallel plate 120 from the light entry surface of the following optical element as measured along the optical axis OA.

Embodiments are furthermore not limited to the case where the planar-parallel plate 120 is coupled through an optical near field to the following light entry surface (in particular the light-coupling surface 130a of the resist 130 which was mentioned in the example). As an alternative, the optical coupling can in particular also be achieved through a suitable immersion medium (see further embodiments).

Figure 3:
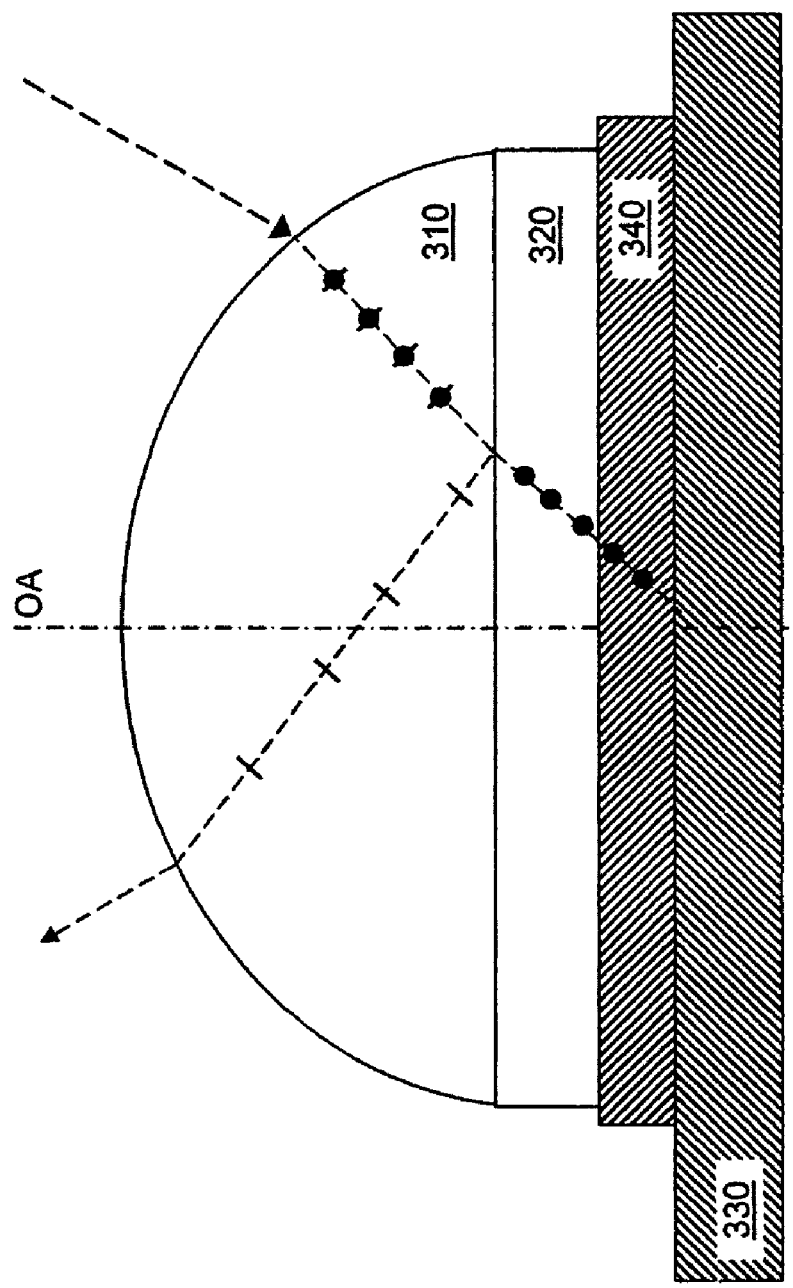
FIGS. 3-7 are schematic representations, each of which shows a schematic representation of a part taken from an imaging system according to further embodiments of the invention.

The embodiment presented in FIG. 3 is distinguished from the embodiment of FIGS. 1 and 2 by the fact that according to FIG. 3 an optical coupling to the light-coupling surface of the resist 330 is achieved through a suitable immersion medium 340 (instead of an optical near field). Otherwise, those elements that perform identical functions are identified by the same reference numbers raised by 100.

Figure 4:
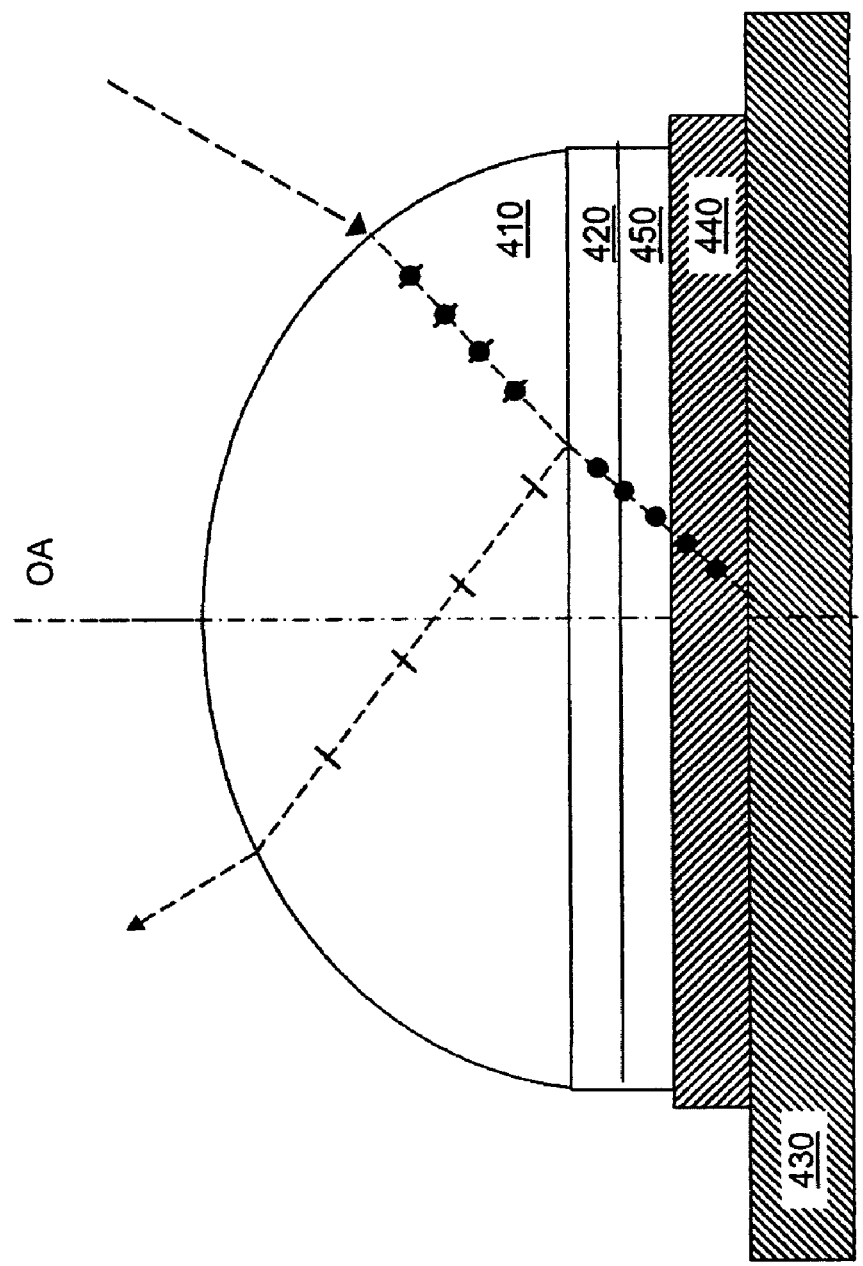

The embodiment presented in FIG. 4 is distinguished from the embodiment of FIG. 3 by the fact that according to FIG. 4 a protective plate 450 is placed over the light exit surface of the planar-parallel plate 420. The protective plate can be made, e.g., of spinel (MgAl$_2$O$_4$). The protective plate 450 can further be made as a thin layer (with a thickness of e.g. λ/30), for example of MgO or Al$_2$O$_3$. The optical coupling to the light-coupling surface of the resist 430 occurs again by way of an appropriate immersion medium 440. Elements performing the same function are again identified by the same reference numbers raised by 100.

Figure 5:
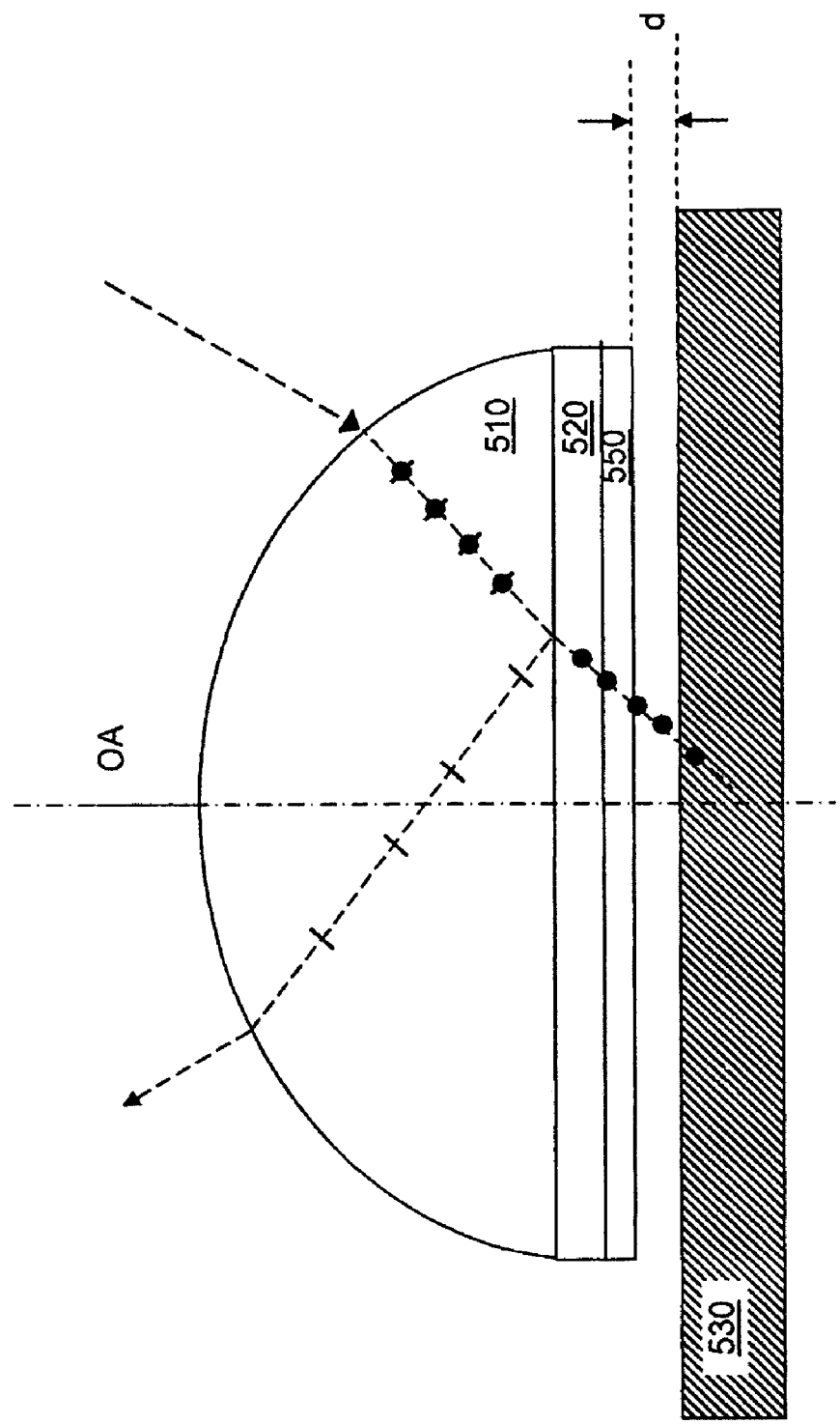

The embodiment presented in FIG. 5 is distinguished from the embodiment of FIG. 4 by the fact that according to FIG. 5 an optical coupling to the light-coupling surface of the resist 530 is achieved through an optical near field. Thus, the light exit surface of the protective layer 550 is arranged at a distance d from the light-coupling surface of the resist 530, with a choice of, e.g. d=λ/20, which at a working wavelength of λ=193 nm corresponds to a distance d1=d2=9.65 nm. The first optical element (the planar-convex lens 510) in the illustrated embodiment is made of quartz glass (SiO$_2$). Otherwise, elements performing the same function are again identified by the same reference numbers raised by 100.

Figure 6:
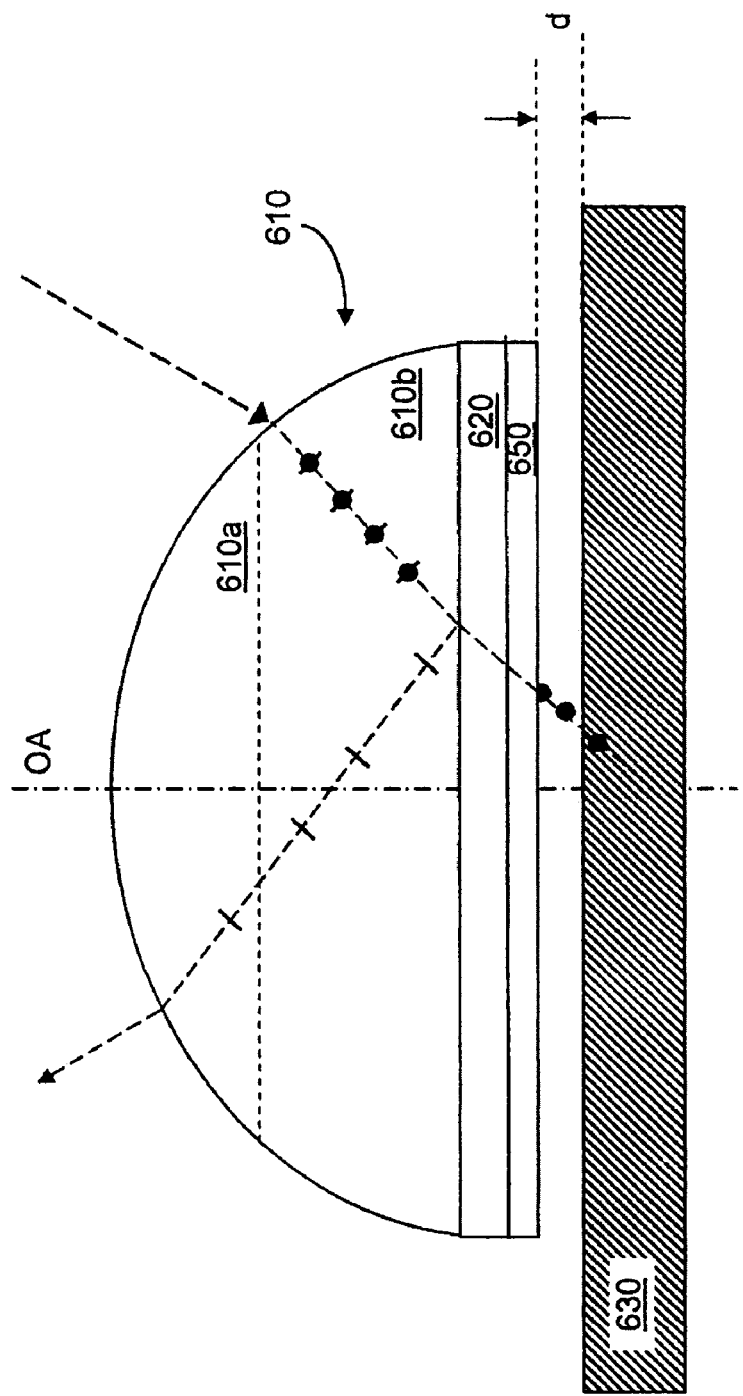

The embodiment presented in FIG. 6 is distinguished from the embodiment of FIG. 5 by the fact that according to FIG. 6 the first optical element (the planar-convex lens 610) is assembled of two partial elements 610a and 610b, which are of the same crystallographic cut (for example pyrope 111) and are arranged relative to each other with a 60° rotation about the optical axis. The planar-parallel plate 620 in the illustrated embodiment can be made, e.g., of sodium nitrate or dolomite.

Figure 7:
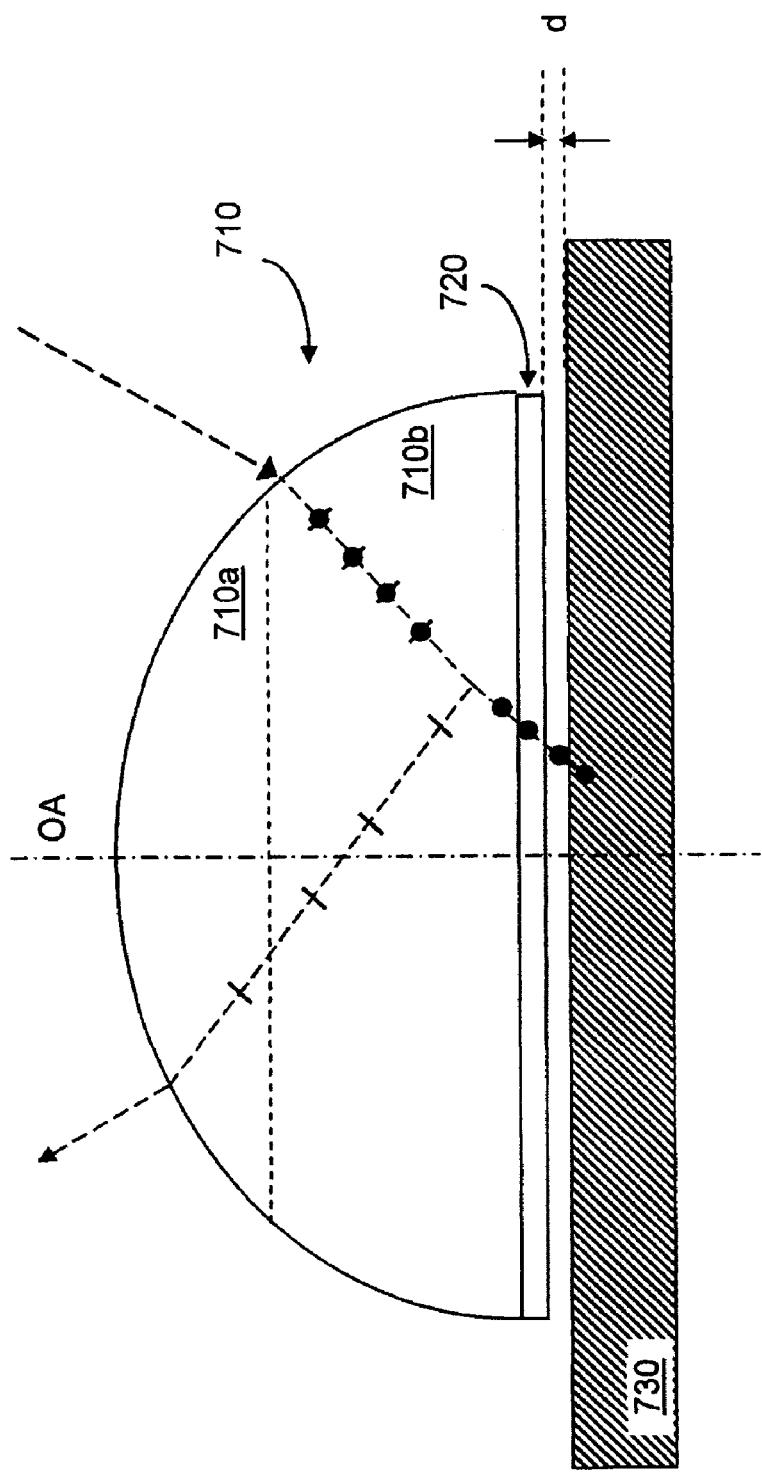

The embodiment presented in FIG. 7 is distinguished from the embodiment of FIG. 6 by the fact that instead of the planar-parallel plate 620, the second optical element according to FIG. 7 is realized by providing a thin layer 720 of calcite (CaCO$_3$) with a thickness of, e.g., about 10 μm. The planar-convex lens 710 in the illustrated embodiment is assembled, e.g., from two partial elements of gehlenite (2CaO.Al$_2$O$_3$SiO$_2$) in (111)-orientation which are of the same crystallographic cut and are arranged relative to each other with a rotation of 60° about their optical axis. Elements performing the same function are identified by the same reference numbers raised by 100.

Figure 8:
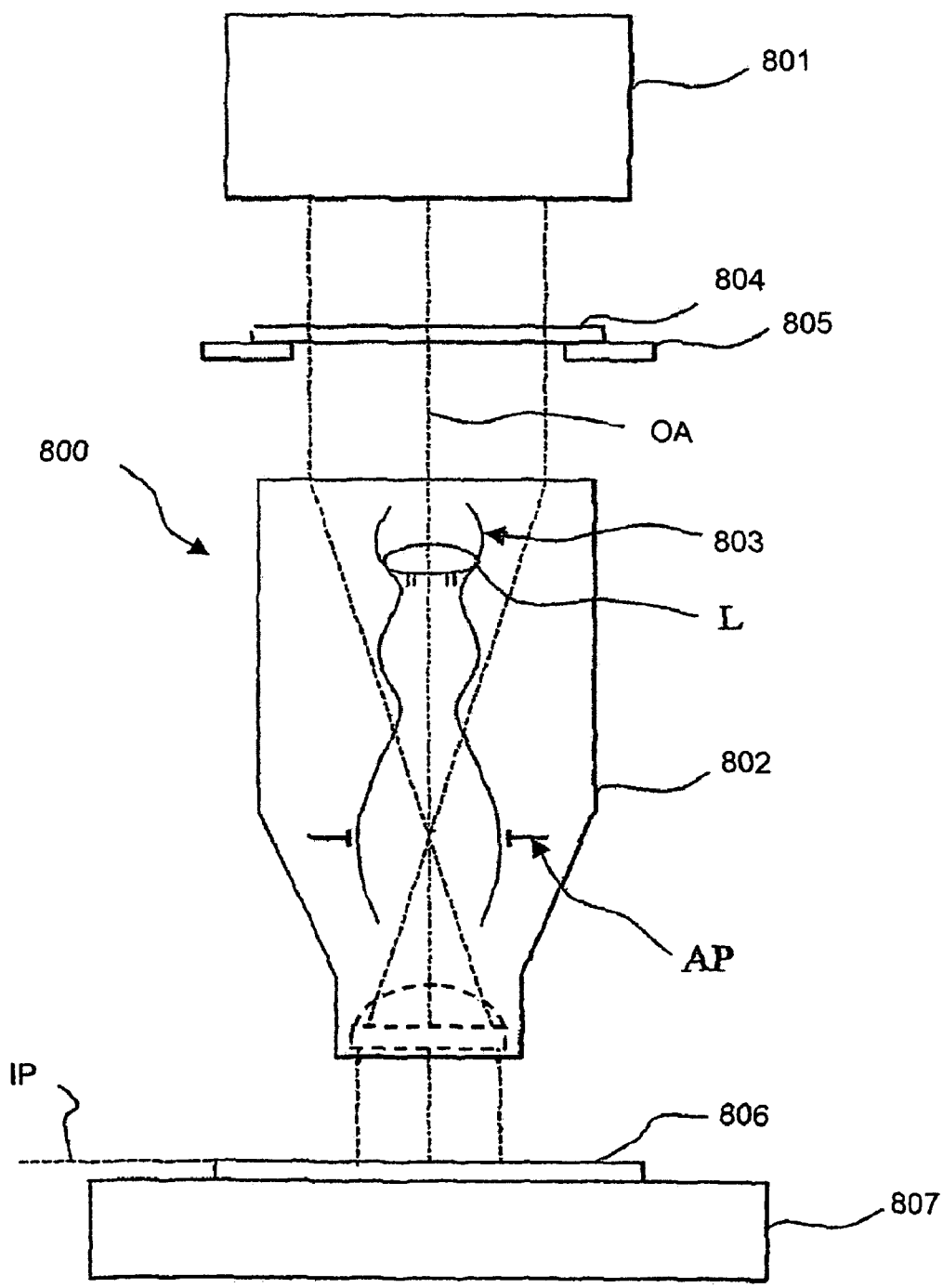
FIG. 8 gives a schematic representation of the principal arrangement of a microlithography projection-exposure apparatus which can include an imaging system according to the invention.

FIG. 8 gives a schematic representation of the layout of a microlithography projection-exposure apparatus with an illumination system.

The projection-exposure apparatus 800 according to FIG. 8 has an illumination device 801 and a projection objective 802. The projection objective 802 includes a lens arrangement 803 with an aperture stop AP, with an optical axis OA being defined by the lens arrangement 803 which is only symbolically indicated. Arranged between the illumination device 801 and the projection objective 802 is a mask 804 which is held in the light path by means of a mask holder 805. Masks 804 of this type, which are used in microlithography, have a structure in the micrometer- to nanometer range. An image of the mask, reduced for example by a factor 4 or 5, is projected by the projection objective 802 onto an image plane IP. A light-sensitive substrate 806, also referred to as a wafer, positioned by a substrate holder 807, is held in the image plane IP. The smallest dimension of a structure that can still be resolved depends on the wavelength λ of the light that is used for the illumination and also on the image-side numerical aperture of the projection objective 802, as the maximum achievable resolution of the projection-exposure apparatus 800 increases with a shorter wavelength λ of the illumination device 801 and with a larger image-side numerical aperture of the projection objective 802.

The illumination device 801 as well as the projection objective 802 can be configured as an imaging system. A possible approximate position of an optical element 120 is indicated in FIG. 1 in broken lines in a merely schematic manner, where the optical element, shown here in a preferred embodiment, is the last optical element on the image side of the projection objective 802 and is thus arranged in the area of relatively high aperture angles. Likewise indicated in broken lines is a planar convex lens 110 which can be of a design that conforms to the embodiments described above.

Notwithstanding the fact that certain embodiments are described, numerous variations and alternative embodiments may become apparent to those acquainted with the field, for example by combining and/or exchanging features of individual embodiments. Further embodiments are in the claims.

The invention claimed is:

1. An imaging system having an optical axis , the imaging system comprising:
   at least one optical element of an optically uniaxial crystal material whose optical crystallographic axis is substantially parallel to the optical axis of the imaging system and which at a working wavelength has an ordinary refractive index $n_o$ and an extraordinary refractive index $n_e$, with the extraordinary refractive index $n_e$ being smaller than the ordinary refractive index $n_o$;
   wherein the optical element is arranged in the ray path pattern in such a way that, at least for rays of the working wavelength which meet the optical element at an angle that falls within an angular range from the optical axis, the p-polarized component is reflected more strongly than the s-polarized component.

2. The imaging system according to claim 1, wherein the optical element is arranged in the ray path pattern in such a way that at least one ray falls on the optical element under an angle to the optical axis which is equal to at least $\arcsin(n_e/n')$, wherein n' indicates that refractive index which applies to the p-polarized component in the medium adjacent to a light entry surface of the optical element, and wherein n' is larger than $n_e$.

3. The imaging system according to claim 2, wherein the optical element is arranged in such a way in the ray path pattern that it is met only by rays which are directed at an angle of at least $\arcsin(n_e/n')$ relative to the optical axis.

4. The imaging system according to claim 2, wherein the optical element is arranged in such a way in the ray path pattern that at least one ray meets the optical element under an angle in the range between $\arcsin(n_e/n')$ and $\arcsin(n_o/n'')$, wherein n" represents the refractive index that applies to the s-polarized component in the medium adjacent to a light entry surface of the optical element, and wherein n" is larger than $n_o$.

5. The imaging system according to claim 4, wherein the optical element is arranged in such a way in the ray path pattern that it is met only by rays that are within an angular range between $\arcsin(n_e/n')$ and $\arcsin(n_o/n'')$ relative to the optical axis.

6. The imaging system according to claim 1, wherein at least for rays that fall on the optical element under an angle that is within a partial range of the angular range for which the p-polarized component is reflected more strongly than the s-polarized component, the p-component is met with total reflection on the optical element.

7. The imaging system according to claim 1, wherein an upper limit of the angular range in which the p-polarized component is reflected more strongly than the s-polarized component is constituted by the maximum aperture angle $\epsilon_{max}$ at the light entry surface of the optical element.

8. The imaging system according to claim 1, wherein a lower limit of the angular range in which the p-polarized component is reflected more strongly than the s-polarized component is smaller than 0.85 times the maximum aperture angle $\epsilon_{max}$.

9. The imaging system according to claim 1, wherein difference $n_o - n_e$ between the ordinary refractive index $n_o$ and the extraordinary refractive index $n_e$ is at least 0.1.

10. The imaging system according claim 1, wherein the optical element is arranged in the ray tracing pattern in such a way that the ray tracing pattern in the optical element is substantially telecentric.

11. The imaging system according to claim 1, wherein at least one lens with a location-dependent variable reflectivity is arranged in the light path in such a way that a location-dependent variation of the transmissivity of the optical element is at least partially compensated.

12. The imaging system according to claim 1, wherein the imaging system has an image plane and the optical element is one of three elements of the imaging system that are located nearest to the image plane, and that preferably said optical element is a last optical element of the imaging system on the image-plane side.

13. The imaging system according to claim 1, wherein the optical element is a planar-parallel plate.

14. The imaging system according to claim 1, wherein the optical element is made of a material which has a trigonal, tetragonal, or hexagonal crystallographic structure.

15. The imaging system according to claim 1, wherein the optical element is made of a material which comprises a $CO_3$ compound.

16. The imaging system according to claim 1, wherein the optical element is made of a mixed crystal material which comprises a metal oxide and a carbon oxide, or of a metal and $CO_3$.

17. The imaging system according to claim 15, wherein the optical element is made of a material selected from the group that includes magnesite ($MgCO_3$), dolomite ($CaMg[CO_3]_2$), rhodochrosite ($MnCO_3$), calcite ($CaCO_3$), smithsonite ($ZnCO_3$), eitelite ($MgNa_2[CO_3]_2$ or $Na_2CO_3 \cdot MgCO_3$), potassium magnesium carbonate ($MgK_2[CO_3]_2$ or $K_2CO_3 \cdot MgCO_3$), butschliite ($Ca_2K_6[CO_3]_5 \cdot 6H_2O$), norsethite ($BaMg[CO_3]_2$ or $BaCO_3 \cdot MgCO_3$), cordylite ($Ce_2Ba[(CO_3)_3F_2]$ or $La_2Ba[(CO_3)_3F_2]$, manganese dolomite ($MnCa[CO_3]_2$ or $MnCO_3 \cdot CaCO_3$) and manganese spar ($MnCO_3$).

18. The imaging system according to claim 1, wherein the optical element is made of a material that comprises an $NO_3$-compound.

19. The imaging system according to claim 18, wherein the optical element is made of sodium nitrate ($NaNO_3$) or lithium nitrate ($LiNO_3$).

20. The imaging system according to claim 1, wherein the optical element is made of a material selected from the group that includes gehlenite ($2CaO.Al_2O_3.SiO_2$), potassium cyanate (KCNO), chioromagnesite ($MgCl_2$), $RbClO_3$, $SrCl_2.6H_2O$, $LiO_3$, $Ba(NO_2)_2.H_2O$, $Al_2O_3MgO$, $[PdCl_4][NH_4)_2$, and barium borate ($BaB_2O_4$).

21. The imaging system according claim 1, wherein the optical element is a second optical element having a light entry surface, wherein a first optical element faces towards said light entry surface of the second optical element, and wherein the first optical element has a refractive index that is larger than the extraordinary refractive index $n_e$ of the second optical element.

22. The imaging system according to claim 21, wherein the first optical element is a planar-convex lens.

23. The imaging system according to claim 21, wherein the light entry surface of the second optical element is in immediate contact with a light exit surface of the first optical element.

24. The imaging system according to claim 23, wherein the second optical element is connected with the first optical element through wringing, seamless joining or a similar technique to form a combined element.

25. The imaging system according to claim 21, wherein in relation to a light exit surface of the first optical element, a light entry surface of the second optical element is arranged in the area of an optical near field.

26. The imaging system according to claim 25, wherein a distance between the light exit surface of the first optical element and the light entry surface of the second optical element is no larger than 0.1 times the working wavelength.

27. The imaging system according to claim 21, wherein an immersion medium is arranged in an area between a light exit surface of the first optical element and the light entry surface of the second optical element or in an area after the light exit surface of the second optical element.

28. The imaging system according to claim 21, wherein the second optical element is a crystalline layer that is put directly onto the light exit surface of the first optical element.

29. The imaging system according to claim 28, wherein the crystalline layer on the light exit surface of the first optical element is at least in individual surface areas grown epitaxially.

30. The imaging system according to claim 28, wherein the thickness of the crystalline layer is equal to at least $1\times\lambda$, wherein $\lambda$ represents the working wavelength.

31. The imaging system according to claim 21, wherein the first optical element is made of a crystal material of cubic crystallographic structure.

32. The imaging system according to claim 21, wherein the first optical element is made of an optically uniaxial crystal material whose optical crystallographic axis is substantially parallel to the optical axis of the imaging system.

33. The imaging system according to claim 31, wherein the first optical element is assembled of at least two partial element which are of the same crystallographic cut and are arranged in positions that are rotated relative to each other about the optical axis.

34. The imaging system according to claim 21, wherein the first optical element is made of an amorphous material.

35. The imaging system according to claim 31, wherein the refractive index of the first optical element is smaller than or equal to the ordinary refractive index of the second optical element.

36. The imaging system according to one of the claims 32, wherein the ordinary refractive index of the first optical element is smaller than or equal to the ordinary refractive index of the second optical element.

37. The imaging system according to claim 1, wherein the second optical element is provided with a protective layer that is substantially impenneable to water and is substantially transparent to light of the working wavelength.

38. The imaging system according to claim 1, wherein the imaging system is telecentric on the image side.

39. The imaging system according to claim 1, wherein the imaging system has an image-side numerical aperture of at least 1.0.

40. The imaging system according to claim 1, wherein the working wavelength is shorter than 250 nm.

41. The imaging system according to claim 21, wherein at least 80% of the light which enters the first optical element is s-polarized.

42. The imaging system according to claim 21, wherein the light which enters the first optical element is non-polarized.

43. The imaging system according to claim 21, wherein the light which enters the first optical element has a right-handed or left-handed circular polarization.

44. The imaging system according to claim 21, wherein the light which enters the first optical element is artificially non-polarized as a result of statistical mixing.

45. A microlithography projection-exposure apparatus with a projection objective comprising the imaging system of claim 1.

46. A microlithography projection-exposure apparatus with an illumination device comprising the imaging system of claim 1.

47. A method for microlithographically producing micro-structured components, comprising:
providing a substrate over at least a part of which a layer of a light-sensitive material has been deposited;
providing a mask which carries the structures to be imaged;
providing a projection-exposure apparatus according to claim 45;
projecting at least a part of the mask onto an area of the layer by means of the projection-exposure apparatus.

48. A micro-structured component made using the method of claim 47.

49. The imaging system according to claim 1, wherein a lower limit of the angular range in which the p-polarized component is reflected more strongly than the s-polarized component is smaller than 0.7 times the maximum aperture angle $\epsilon_{max}$.

50. The imaging system according to claim 1, wherein a lower limit of the angular range in which the p-polarized component is reflected more strongly than the s-polarized component is smaller than 0.5 times the maximum aperture angle $\epsilon_{max}$.

51. The imaging system according to claim 1, wherein difference $n_o - n_e$ between the ordinary refractive index $n_o$ and the extraordinary refractive index $n_e$ is at least 0.2.

52. The imaging system according to claim 1, wherein difference $n_o - n_e$ between the ordinary refractive index $n_o$ and the extraordinary refractive index $n_e$ is at least 0.25.

53. The imaging system according to claim 25, wherein a distance between the light exit surface of the first optical element and the light entry surface of the second optical element is no larger than 0.05 times the working wavelength.

54. The imaging system according to claim 25, wherein a distance between the light exit surface of the first optical element and the light entry surface of the second optical element is no larger than 0.03 times the working wavelength.

55. The imaging system according to claim 28, wherein the thickness of the crystalline layer is equal to at least $2\times\lambda$, wherein $\lambda$ represents the working wavelength.

56. The imaging system according to claim 28, wherein the thickness of the crystalline layer is equal to at least $4\times\lambda$, wherein $\lambda$ represents the working wavelength.

57. The imaging system according to claim 1, wherein the imaging system has an image-side numerical aperture of at least 1.25.

58. The imaging system according to claim 1, wherein the imaging system has an image-side numerical aperture of at least 1.4.

59. The imaging system according to claim 1, wherein the working wavelength is shorter than 200 nm.

60. The imaging system according to claim 1, wherein the working wavelength is shorter than 160 nm.

61. The imaging system according to claim 21, wherein at least 90% of the light which enters the first optical element is s-polarized.

\* \* \* \* \*

UNITED STATES PATENT AND TRADEMARK OFFICE
CERTIFICATE OF CORRECTION

PATENT NO. : 7,375,897 B2
APPLICATION NO. : 11/298019
DATED : May 20, 2008
INVENTOR(S) : Schuster It is certified that error appears in the above-identified patent and that said Letters Patent is hereby corrected as shown below:

On the Title page, in Item 56, under "U.S. Patent Documents", in column 2, line 2, delete "Hoffmann" and insert -- Hoffman --, therefor.

In column 4, line 50, delete "$[CO_{3]2}$" and insert -- $[CO_3]_2$ --, therefor.

In column 7, line 10, delete "no" and insert -- $n_o$ --, therefor.

In column 8, line 28, delete "≈56.640." and insert -- ≈56.64°. --, therefor.

In column 8, line 43, delete " $\delta_{s,TR}$ " and insert -- $\varepsilon_{s,TR}$ --, therefor.

In column 9, line 2, delete "$n_o$," and insert -- $n_o'$ --, therefor.

In column 13, line 37, in claim 1, delete "axis ," and insert -- axis, --, therefor.

In column 14, line 65, in claim 17, delete "]or" and insert -- ] or --, therefor.

In column 15, line 10, in claim 20, delete "chioromagnesite" and insert -- chloromagnesite --, therefor.

In column 15, line 11, in claim 20, delete "$SrCl_26H_2O$," and insert -- $SrCl_2·6H_2O$, --, therefor.

In column 15, line 11, in claim 20, delete "$Al_2O_3MgO$," and insert -- $Al_2O_3·MgO$, --, therefor.

In column 16, line 5, in claim 36, after "according to" delete "one of the claims 32," and insert -- claim 32, --, therefor.

In column 16, line 5, in claim 36, delete "The imaging system according to one of the claims 32" and insert -- The imaging system according to claim 32 --, therefor.

In column 16, line 11, in claim 37, delete "impenneable" and insert -- impermeable --, therefor.

Signed and Sealed this

Twenty-fifth Day of May, 2010

David J. Kappos
*Director of the United States Patent and Trademark Office*

In column 16, line 61, in claim 51, delete "$n_o$ -$n_e$" and insert -- $n_o$-$n_e$ --, therefor.